(12) United States Patent
Xie et al.

(10) Patent No.: US 10,563,304 B2
(45) Date of Patent: Feb. 18, 2020

(54) METHODS AND APPARATUS FOR DYNAMICALLY TREATING ATOMIC LAYER DEPOSITION FILMS IN PHYSICAL VAPOR DEPOSITION CHAMBERS

(71) Applicant: APPLIED MATERIALS, INC., Santa Clara, CA (US)

(72) Inventors: Xiangjin Xie, Fremont, CA (US); Adolph Miller Allen, Oakland, CA (US); Xianmin Tang, San Jose, CA (US); Goichi Yoshidome, Albany, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 225 days.

(21) Appl. No.: 15/482,198

(22) Filed: Apr. 7, 2017

(65) Prior Publication Data

US 2018/0294162 A1  Oct. 11, 2018

(51) Int. Cl.
*H01L 21/3215* (2006.01)
*H01L 21/768* (2006.01)
(Continued)

(52) U.S. Cl.
CPC ...... *C23C 16/45525* (2013.01); *C23C 14/024* (2013.01); *C23C 14/225* (2013.01); *C23C 14/345* (2013.01); *C23C 14/3464* (2013.01); *C23C 14/3471* (2013.01); *C23C 14/541* (2013.01); *C23C 14/564* (2013.01);
(Continued)

(58) Field of Classification Search
CPC ............. H01L 21/28556; H01L 21/321; H01L 21/3215; H01L 21/6831; H01L 21/76856; H01L 21/2855; H01L 21/28562; H01L 21/76843; H01L 21/76865; H01L 23/53238; C23C 14/024; C23C 14/225; C23C 14/345; C23C 14/3464; C23C 14/3471; C23C 14/541; C23C 14/564;
(Continued)

(56) References Cited

U.S. PATENT DOCUMENTS 6,077,402 A  6/2000  Hong et al.
6,350,353 B2  2/2002  Gopalraja et al.
(Continued)

OTHER PUBLICATIONS

International Search Report and Written Opinion dated Jul. 26, 2018, for PCT Application No. PCT/US2018/025793.

*Primary Examiner* — Duy T Nguyen
(74) *Attorney, Agent, or Firm* — Moser Taboada; Alan Taboada

(57) ABSTRACT

Atomic layer deposition (ALD) processes are combined with physical vapor deposition (PVD) processes in a low pressure environment to produce a high quality barrier film. The initial barrier film is deposited on a substrate using ALD processes and then moved to a PVD chamber to treat the barrier film to increase the barrier film's density and purity, decreasing the barrier film's resistivity. A dual source of materials is sputtered onto the substrate to provide doping while a gas is simultaneously used to etch the substrate to release nitrogen. At least one source of material is positioned to provide doping at an acute angle to the surface of the substrate while supplied with DC power and RF power at a first RF power frequency. The substrate is biased using RF power at a second RF power frequency.

19 Claims, 4 Drawing Sheets

(51) Int. Cl.
*C23C 14/34* (2006.01)
*H01L 21/321* (2006.01)
*C23C 14/54* (2006.01)
*H01L 21/683* (2006.01)
*H01L 21/285* (2006.01)
*C23C 16/455* (2006.01)
*C23C 14/58* (2006.01)
*C23C 14/22* (2006.01)
*C23C 16/02* (2006.01)
*C23C 14/56* (2006.01)
*C23C 16/56* (2006.01)
*H01J 37/32* (2006.01)
*C23C 14/02* (2006.01)
*H01L 23/532* (2006.01)
*H01J 37/34* (2006.01)
*H01J 3/34* (2006.01)

(52) U.S. Cl.
CPC ...... *C23C 14/5873* (2013.01); *C23C 16/0272* (2013.01); *C23C 16/56* (2013.01); *H01J 37/321* (2013.01); *H01J 37/32146* (2013.01); *H01J 37/34* (2013.01); *H01L 21/2855* (2013.01); *H01L 21/321* (2013.01); *H01L 21/3215* (2013.01); *H01L 21/6831* (2013.01); *H01L 21/76856* (2013.01); *H01L 21/76865* (2013.01); *H01L 23/53238* (2013.01); *H01L 21/28562* (2013.01); *H01L 21/76843* (2013.01)

(58) Field of Classification Search
CPC ............ C23C 14/5873; C23C 16/0272; C23C 16/45525; C23C 16/56
See application file for complete search history.

(56) References Cited

U.S. PATENT DOCUMENTS

| | | | |
|---|---|---|---|
| 6,699,783 | B2 | 3/2004 | Raaijmakers et al. |
| 6,740,585 | B2 | 5/2004 | Yoon et al. |
| 7,049,226 | B2 | 5/2006 | Chung et al. |
| 7,211,508 | B2 | 5/2007 | Chung et al. |
| 7,781,326 | B2 * | 8/2010 | Seutter ............... C23C 16/34 438/622 |
| 2001/0001190 | A1 | 5/2001 | Leiphart |
| 2002/0033328 | A1 | 3/2002 | Stimson |
| 2003/0192476 | A1 | 10/2003 | Fork et al. |
| 2005/0098427 | A1 | 5/2005 | Cho et al. |
| 2005/0263390 | A1 * | 12/2005 | Gung ................ C23C 14/046 204/192.17 |
| 2005/0277292 | A1 * | 12/2005 | Peng ............. H01L 21/28562 438/672 |
| 2006/0057843 | A1 * | 3/2006 | Chen ................ C23C 14/022 438/637 |
| 2010/0096255 | A1 * | 4/2010 | Ye ................... C23C 14/046 204/192.15 |
| 2016/0276218 | A1 * | 9/2016 | Matsumoto ....... H01L 23/53238 |

\* cited by examiner

METHODS AND APPARATUS FOR DYNAMICALLY TREATING ATOMIC LAYER DEPOSITION FILMS IN PHYSICAL VAPOR DEPOSITION CHAMBERS

FIELD

Embodiments of the present disclosure generally relate to substrate processes.

BACKGROUND

A substrate is used to build structures or devices for the semiconductor industry. The devices are constructed using thin film deposition to deposit layers of materials to form conductors, vias, semiconductors, and other structures/devices. As the sizes of the devices shrink due to the demand for smaller and faster electronics, greater control over the thin film process is required to ensure proper device construction. The smaller size has led to a shift from using physical vapor deposition (PVD) chambers to atomic layer deposition (ALD) chambers. The ALD chambers allow surface control methods to produce highly uniform films over the entire device structure. However, when ALD chambers are used to produce barrier films, the barrier films have a high resistivity due to the low density of the ALD films, producing a poor quality barrier film. PVD chambers produce good barrier properties with high density and lower resistivity, but are non-conformal, resulting in improperly constructed devices on the substrate.

Accordingly, the inventors have provided embodiments of an improved process for producing barrier films.

SUMMARY

ALD processes are combined with PVD processes in a low pressure environment to produce a high quality barrier film. The initial barrier film is deposited on a substrate using ALD processes and then moved to a PVD chamber to treat the barrier film to increase the barrier film's density and purity, decreasing the barrier film's resistivity.

In some embodiments, a method is provided for performing a dynamic treatment on an atomic layer deposition (ALD) film on a substrate. The method comprises pressurizing a process chamber greater than zero to less than about 10 mTorr, sputtering first and second sources of a material onto the ALD film, the first source of a material supplied with RF power or DC power and the second source of a material supplied with RF power at a first RF power frequency and with DC power, biasing the ALD film with RF power at a second RF power frequency and etching the ALD film with at least one gas while sputtering the first and second sources of a material.

In other embodiments, the method can further comprise in any order or combination the following—sputtering at an acute angle to the ALD film with the second source of a material, etching the ALD film with at least one of a noble gas, a nitrogen-based gas, or an oxygen-based gas, sputtering with the second source of a material at a first RF power frequency of about 1.8 MHz to about 2.2 MHz, biasing the ALD film with a second RF power frequency greater than the first RF power frequency, treating the ALD film at a temperature of about 15 degrees Celsius to about 400 degrees Celsius, performing the dynamic treatment up to about 10 seconds, degassing and pre-cleaning the ALD film, sputtering with only the second source of a material onto the ALD film while the second source of a material is at about 0 volts to about −1000 volts and etching the ALD film with at least one gas in an about 0 volts to about −300 volts energy state while sputtering the second source of a material at about 0 volts to −1000 volts, sputtering the second source of a material at an acute angle to a surface of the substrate, doping or sputtering the ALD film with a material based, at least partially, on tantalum or niobium, treating an ALD film comprising at least one of tantalum nitride or niobium nitride, applying the treatment during at least a part of a process to produce a film stack, the film stack comprising at least one selected from the group consisting of a tantalum nitride/cobalt film stack, a tantalum nitride/cobalt/copper film stack, a tantalum nitride/tantalum/ruthenium/copper film stack, and a tantalum nitride/ruthenium/copper film stack.

In other embodiments, a method for processing an ALD film on a substrate using an integrated tool can comprise depositing an ALD film on a substrate in an ALD process chamber, transferring the substrate to a PVD process chamber without a vacuum break, pressurizing the PVD process chamber to a pressure greater than zero pressure to less than about 10 mTorr, doping the ALD film with a first material and a second material simultaneously, and etching the ALD film with at least one gas while doping the ALD film with the first material and the second material.

In other embodiments, the method can further comprise in any order or combination the following—doping the ALD film with the first material by sputtering the first material using DC power, doping the ALD film with the second material by sputtering the second material using a DC power and an RF power at a first RF power frequency, and biasing the substrate with an RF power at a second RF power frequency; and/or supplying the first RF power frequency at a power level of about 100 watts and less than about 5000 watts and supplying the second RF power frequency at a power level of about 100 watts and less than about 1000 watts.

In other embodiments, an apparatus for film deposition on a substrate, comprising a process chamber having an interior volume with a substrate support, a target, and an inductive coil located between the substrate support and the target; a gas supply fluidly coupled to the interior volume of the process chamber that provides an etching gas; a first power supply interacting with the substrate support to supply an RF power at a first frequency; a second power supply interacting with the inductive coil to supply a first DC power and an RF power at a second frequency less than the first frequency; a third power supply interacting with the target to supply a second DC power; and a controller that adjusts a first RF power level of the first power supply, a second RF power level of the second power supply, a first DC power level of the second power supply, and a second DC power level of the third power supply while sputtering the target or inductive coil and while regulating a flow of the etching gas into the interior volume of the process chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered

Figure 1:
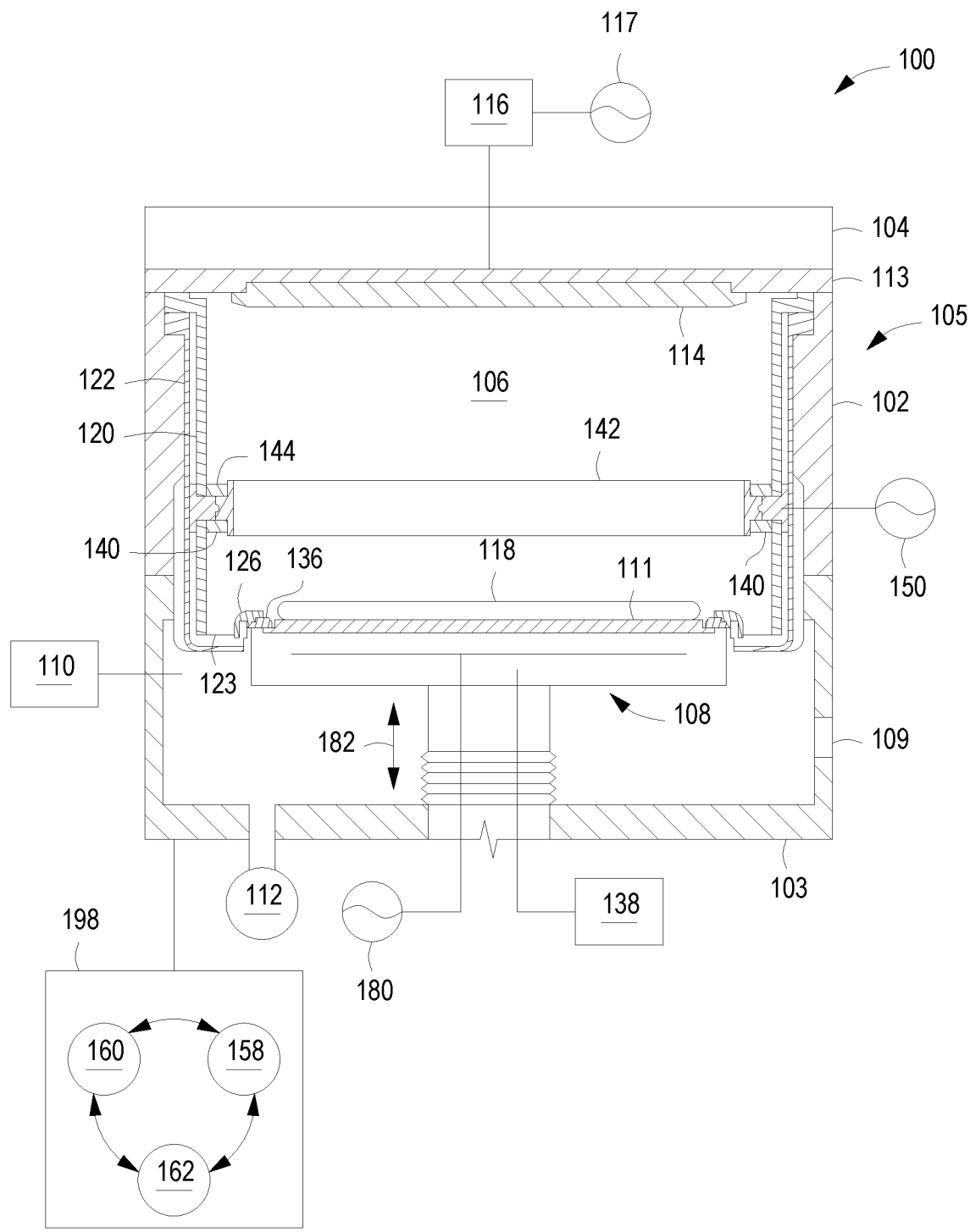
FIG. 1 depicts a cross sectional view of a PVD process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The term "about" as used herein means approximately or nearly and in the context of a numerical value or range set forth means a variation of ±15%, or less, of the numerical value. For example, a value differing by ±14%, ±10%, or ±5% would satisfy the definition of about.

ALD processes are combined with PVD processes to produce a high quality barrier film. The initial barrier film is deposited on a substrate using ALD processes and then moved to a PVD chamber to treat the barrier film to increase the barrier film's density and purity, decreasing the barrier film's resistivity. The processes can be performed with or without a vacuum break between processes.

For substrate devices sized 7 nm and smaller, PVD barrier films and copper (Cu) interconnects becomes more challenging in RC (resistance/capacitance) reduction (interconnect time delay). A much thinner barrier is required in order to reduce the resistance (R). One also needs to consider improving reflow or electro copper plating (ECP) performance by tuning the barrier process. A continuous barrier is required for an effective Cu barrier. Bevel damage, overhang, via resistance and conformality issues, when combined together, are very challenging to overcome for a PVD process. Using ALD processes with tantalum nitride (TaN) typically yields good conformal coverage. However, ALD TaN film has low density (due to being nitrogen rich) and higher resistivity. So ALD TaN film is not an effective barrier, and ALD TaN film also causes higher via resistance (due to the uniform film deposition filling the bottom of the via). Plasma Enhanced ALD (PEALD) TaN can improve TaN film density but with a penalty of damaging low k material (time-dependent dielectric breakdown (TDDB) issue). The techniques described herein provide solutions to treat ALD films (e.g., TaN films) with a PVD approach and improve ALD films for barrier applications (e.g., Cu barrier applications) for 7 nm and below structures. The approach can also be used to increase the density of other ALD or CVD films for other applications. Typical film stacks that can be processed can include film stacks with, for example, cobalt (Co) and ruthenium (Ru) such as, for example, TaN/Co, TaN/Co/Cu, TaN/Ta/Ru/Cu, or TaN/Ru/Cu and the like.

The methods disclosed are applicable to materials and films other than TaN such as niobium nitride (NbN) and others. However, for the sake of simplicity, most embodiments described will use TaN as an example. A film (e.g., TaN) is first deposited on a substrate in an ALD chamber. The substrate is then placed in a PVD chamber having a dual frequency (a first and second frequency) which can be used for selective removal of nitrogen from the ALD film and densifying the ALD film to achieve a PVD-like film for barrier applications. The PVD chamber has dual material sources (a target and a coil) (first and second sources) that can also provide a metal (e.g., tantalum) source for bevel protection and sidewall treatment. The process can be carried out in an integrated processing system (i.e., cluster tool) or using single standalone chambers. When an integrated processing system is used, the ALD film is deposited on a substrate and then the substrate is transferred to the PVD chamber for treatment without having a vacuum break. The absence of a vacuum break reduces the overall processing time. However, the process can also be completed using standalone chambers. After the deposition of the film on a substrate in an ALD chamber, the substrate will encounter a vacuum break and is degassed and pre-cleaned before insertion into a PVD chamber for treatment.

FIG. 1 depicts a schematic, cross-sectional view of an illustrative process chamber 100 (e.g., a PVD chamber) in accordance with some embodiments of the present disclosure. Examples of suitable PVD chambers include the ENCORE® II and ENCORE® III as well as other PVD processing chambers, commercially available from Applied Materials, Inc., Santa Clara, of California. However, the methods disclosed may also be used in processing chambers available from other manufacturers. In one embodiment, the process chamber 100 is capable of depositing, for example, tantalum, tantalum nitride, titanium nitride, tungsten, tungsten nitride, niobium, niobium nitride and the like, on a substrate 118.

The process chamber 100 has a chamber body 105 that includes sidewalls 102, a bottom 103, and a lid assembly 104 all of which enclose an interior volume 106. A substrate support 108 is disposed in a lower portion of the interior volume 106 of the process chamber 100 opposite a target 114. A substrate transfer port 109 is formed in the sidewalls 102 for transferring substrates into and out of the interior volume 106.

A gas source 110 is coupled to the process chamber 100 to supply process gases into the interior volume 106. In one embodiment, process gases may include inert gases, non-reactive gases, and reactive gases, etc. Examples of process gases that may be provided by the gas source 110 include, but not limited to, argon gas (Ar), helium (He), neon gas (Ne), nitrogen gas ($N_2$), oxygen gas ($O_2$), and $H_2O$ among others.

A pump 112 is coupled to the process chamber 100 in communication with the interior volume 106 to control the pressure of the interior volume 106. In one embodiment, the pressure of the process chamber 100 may be maintained at greater than zero pressure to about 10 mTorr or less. In another embodiment, the pressure within the process chamber 100 may be maintained at about 3 mTorr.

A backing plate 113 may support the target 114 in an upper portion of the interior volume 106. The target 114 generally provides a source of material which will be deposited on the substrate 118. The target 114 may be fabricated from a material containing titanium (Ti) metal, tantalum metal (Ta), niobium (Nb) metal, tungsten (W) metal, cobalt (Co), nickel (Ni), copper (Cu), aluminum (Al), alloys thereof, combinations thereof, or the like. In an exemplary embodiment depicted herein, the target 114 may be fabricated with tantalum metal (Ta) or niobium metal (Nb).

The target 114 may be coupled to a source assembly 116 comprising a power supply 117 for the target 114. In some embodiments, the power supply 117 may be an RF power supply. In some embodiments, the power supply 117 may alternatively be a DC source power supply. In some embodiments, the power supply 117 may include both DC and RF power sources.

An additional RF power source 180 may also be coupled to the process chamber 100 through the substrate support 108 to provide a bias power between the target 114 and the substrate support 108. In one embodiment, the RF power source 180 may provide power to the substrate support 108 to bias the substrate 118 at a frequency between about 1 MHz and about 100 MHz, such as about 13.56 MHz.

The substrate support 108 may be moveable between a raised position and a lowered position, as shown by arrow 182. In the lowered position, a support surface 111 of the substrate support 108 may be aligned with or just below the substrate transfer port 109 to facilitate entry and removal of the substrate 118 from the process chamber 100. The support surface 111 may have an edge deposition ring 136 sized to receive the substrate 118 thereon while protecting the substrate support 108 from plasma and deposited material. The substrate support 108 may be moved to the raised position closer to the target 114 for processing the substrate 118 in the process chamber 100. A cover ring 126 may engage the edge deposition ring 136 when the substrate support 108 is in the raised position. The cover ring 126 may prevent deposition material from bridging between the substrate 118 and the substrate support 108. When the substrate support 108 is in the lowered position, the cover ring 126 is suspended above the substrate support 108 and substrate 118 positioned thereon to allow for substrate transfer.

During substrate transfer such as from an ALD chamber to the process chamber 100, a robot blade (not shown) having the substrate 118 thereon is extended through the substrate transfer port 109. Lift pins (not shown) extend through the support surface 111 of the substrate support 108 to lift the substrate 118 from the support surface 111 of the substrate support 108, thus allowing space for the robot blade to pass between the substrate 118 and substrate support 108. The robot may then carry the substrate 118 out of the process chamber 100 through the substrate transfer port 109. Raising and lowering of the substrate support 108 and/or the lift pins may be controlled by a controller 198.

During sputter deposition, the temperature of the substrate 118 may be controlled by utilizing a thermal controller 138 disposed in the substrate support 108. The substrate 118 may be optionally heated to a desired temperature for processing. In some embodiments, the optional heating can be used to bring the substrate and/or film temperature to a temperature of about 200 to about 400 degrees Celsius. In other embodiments, the substrate may be processed at room temperature (about 15 degrees Celsius to about 30 degrees Celsius). In other embodiments the temperature can include a range of about 15 degrees to about 400 degrees Celsius. After processing, the substrate 118 may be rapidly cooled utilizing the thermal controller 138 disposed in the substrate support 108. The thermal controller 138 controls the temperature of the substrate 118, and may be utilized to change the temperature of the substrate 118 from a first temperature to a second temperature in a matter of seconds to about a minute.

An inner shield 120 may be positioned in the interior volume 106 between the target 114 and the substrate support 108. The inner shield 120 may be formed of aluminum or stainless steel among other materials. In one embodiment, the inner shield 120 is formed from stainless steel. An outer shield 122 may be formed between the inner shield 120 and the sidewall 102. The outer shield 122 may be formed from aluminum or stainless steel among other materials. The outer shield 122 may extend past the inner shield 120 and is configured to support the cover ring 126 when the substrate support 108 is in the lowered position.

In one embodiment, the inner shield 120 includes a radial flange 123 that includes an inner diameter that is greater than an outer diameter of the inner shield 120. The radial flange 123 extends from the inner shield 120 at an angle greater than about ninety degrees (90°) relative to the inside diameter surface of the inner shield 120. The radial flange 123 may be a circular ridge extending from the surface of the inner shield 120 and is generally adapted to mate with a recess formed in the cover ring 126 disposed on the substrate support 108. The recessed may be a circular groove formed in the cover ring 126 which centers the cover ring 126 with respect to the longitudinal axis of the substrate support 108.

In some embodiments, the process chamber 100 may include an inductive coil 142. The inductive coil 142 of the process chamber 100 may having one turn or more than one turn. The inductive coil 142 may be just inside the inner shield 120 and positioned above the substrate support 108. The inductive coil 142 may be positioned nearer to the substrate support 108 than the target 114. The inductive coil 142 may be formed from a material similar in composition to the target 114, such as, for example, tantalum or niobium, to act as a secondary sputtering target. The inductive coil 142 is supported from the inner shield 120 by a plurality of coil spacers 140. The coil spacers 140 may electrically isolated the inductive coil 142 from the inner shield 120 and other chamber components.

The inductive coil 142 may be coupled to a power source 150. The power source 150 may have electrical leads which penetrate the sidewall 102 of the process chamber 100, the outer shield 122, the inner shield 120 and the coil spacers 140. The electrical leads connect to a tab 144 on the inductive coil 142 for providing power to the inductive coil 142. The tab 144 may have a plurality of insulated electrical connections for providing power to the inductive coil 142. Additionally, the tabs 144 may be configured to interface with the coil spacers 140 and support the inductive coil 142. The power source 150, in one embodiment, applies current to the inductive coil 142 to induce an RF field within the process chamber 100 and couple power to the plasma for increasing the plasma density, i.e., concentration of reactive ions. In some embodiments, the inductive coil 142 is operated at an RF power frequency less than the RF power frequency of the RF power source 180. In one embodiment, the RF power frequency supplied to the inductive coil 142 is about 2 MHz. In other embodiments the RF power frequency may operate in a range of about 1.8 MHz to about 2.2 MHz. In other embodiments, the RF power frequency may range from about 0.1 MHz to 99 MHz. In some embodiments, the inductive coil 142 is made of a material, such as a metal material, that can be sputtered onto a substrate. The power source 150 may then also apply DC power to the inductive coil 142 to enable sputtering of the inductive coil 142 while coupling RF power to the plasma.

A controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the process chamber 100 and controlling ion bombardment of the target 114 and the inductive coil 142. In one embodiment, the controller 198 adjusts a first RF power level of a first power supply (e.g., RF power source 180), a second RF power level of a second power supply (e.g., power source 150), a first DC power level of the second power supply (e.g., power source 150), and a second DC power level of a third power supply (e.g., power supply 117) while sputtering the target and/or inductive coil and while regulating a flow of an etching gas into the interior volume 106 of the process chamber 100.

The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU 160 into a specific purpose computer (controller) 198 that controls the process chamber 100 such that processes are performed in accordance with the present disclosure. The software routines may also be stored and/or executed by a second controller (not shown) that is located remotely from the process chamber 100.

Figure 2:
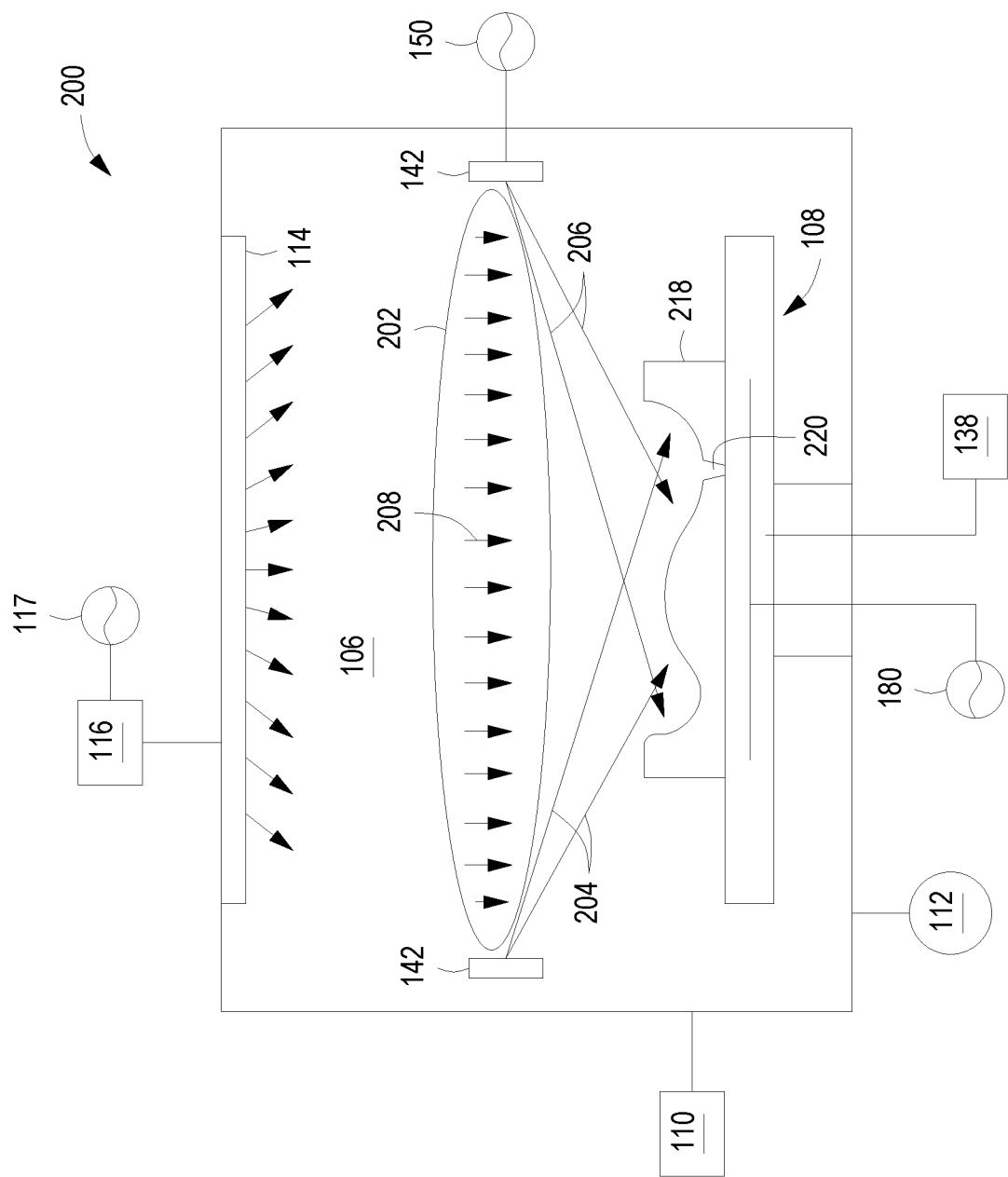
FIG. 2 depicts a representational view of an interior volume of the PVD process chamber of FIG. 1 in accordance with some embodiments of the present disclosure.

FIG. 2 is a representational view 200 of the interior volume 106 of the process chamber 100 during processing of a substrate 218. The substrate 218 is shown not in scale so that features of a device on the substrate 218 can be easily seen for illustrative purposes. When processing the substrate 218, the PVD process chamber uses power supply 117 and power source 150 for sputtering a metal such as, for example, tantalum or niobium or a derivative thereof, etc. In some embodiments, the power supply 117 operates to produce DC power to sputter a metallic target while the power source 150 operates as a DC source to sputter the inductive coil 142 and operates as an RF power source at a frequency less than the operating RF frequency of the RF power source 180 to increase the plasma density in the interior volume 106. In some embodiments the power source 150 operates at an RF power frequency of about 0.1 MHz to 99 MHz. In other embodiments the power source 150 operates at an RF power frequency of about 1.8 MHz to about 2.2 MHz.

In some embodiments, the target 114 and the inductive coil 142 are composed of the same material such as, for example, tantalum or niobium, etc. The dual sources aid in providing a stable plasma and enough energy to selectively etch nitrogen while keeping a metal film intact or at least minimally etched. The RF power source 180 operates at an RF power frequency greater than the operating RF power frequency of the power source 150 to bias the substrate 218. In some embodiments the RF power source 180 operates at an RF power frequency of about 1 MHz to about 100 MHz. In other embodiments, the RF power source operates at an RF power frequency of about 13.56 MHz.

In some embodiments, the gas source 110 supplies a gas 208 into the interior volume 106. In some embodiments, the gas 208 can be a noble gas such as, for example, argon (Ar), helium (He), xenon (Xe), neon (Ne), or krypton (Kr). In some embodiments, the gas 208 can also be a reactive gas, such as, for example, nitrogen ($N_2$) or oxygen ($O_2$). In some embodiments, the gas 208 can also be a combination of a one or more noble gases and one or more reactive gases. The gas 208 is introduced into plasma 202 formed above the substrate 218. The pump 212 keeps the interior volume 106 at a pressure of less than about 10 mTorr while the thermal controller 138 keeps the substrate 218 at about 200 to about 400 degrees Celsius or at room temperature (about 15 degrees Celsius to about 30 degrees Celsius). The target 114 sputters ions at random angles incident to the substrate 218 and, often, the angles do not provide good coverage on vertical or near vertical (sloping) features. The inductive coil 142 provides ions sputtered at acute angles 204, 206 to the substrate 218 to provide coverage on sidewall, bevels, and sloping features of structures on the substrate 218.

Figure 3:
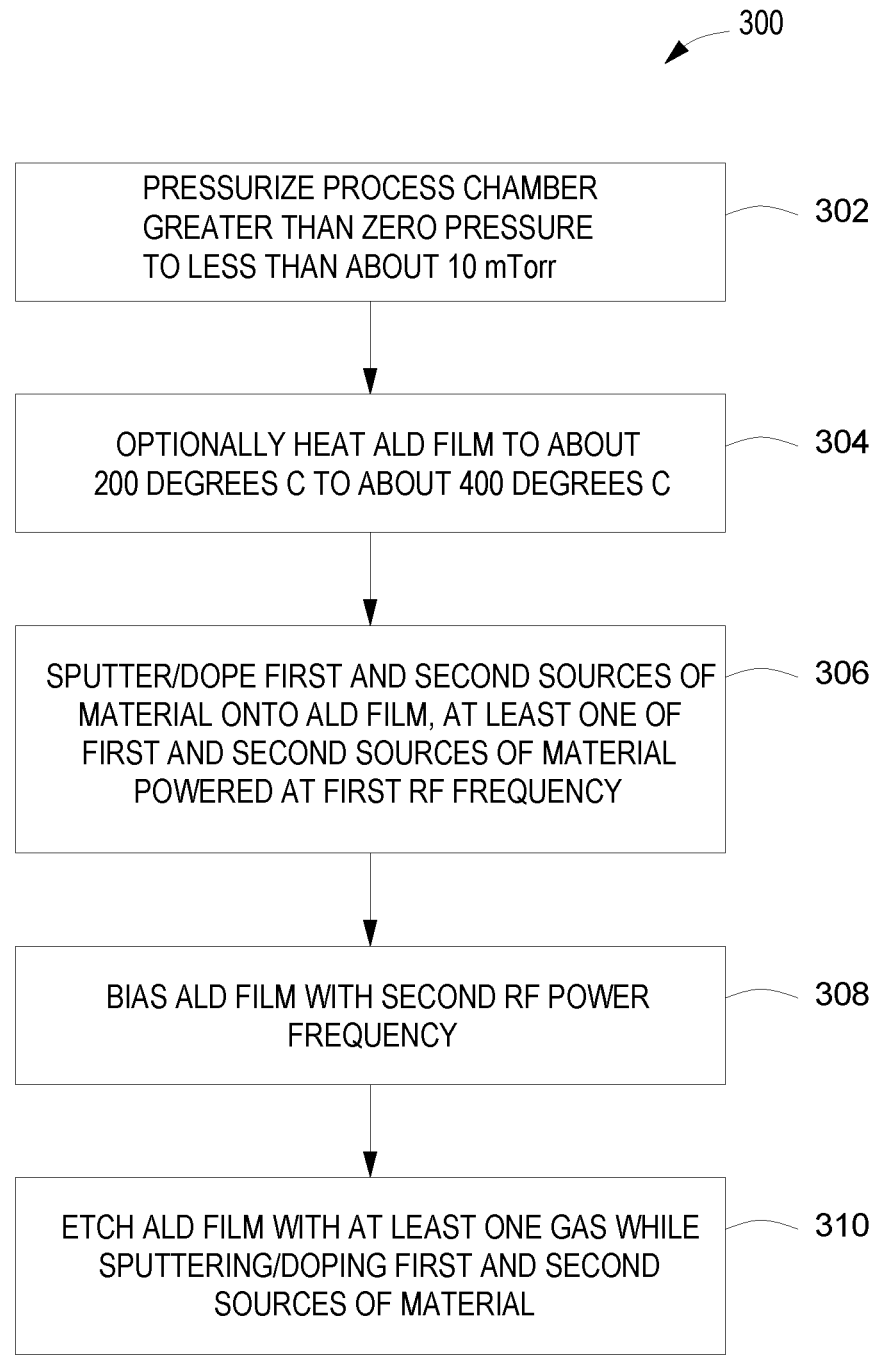
FIG. 3 depicts a flow diagram of a method of processing a substrate in accordance with some embodiments of the present disclosure.

FIG. 3 is a method 300 for processing film deposited on a substrate according to embodiments of the present disclosure. The processes are shown in an orderly fashion, but there is no requirement that the processes be performed in an exact sequence or that all processes must be performed. Some processes may come before or after other processes or be performed at the same time. Iterations can occur between processes before performing other processes. References are made to elements shown in both FIGS. 1 and 2. An ALD film on a substrate is inserted into a PVD chamber and method 300 starts by pressurizing the process chamber greater than zero pressure to less than about 10 mTorr as indicated at 302. In some embodiments, the process chamber is maintained at about 3 mTorr.

In some embodiments, the ALD film/substrate temperature may be at room temperature during processing. In other embodiments, instead of performing the process with the substrate at room temperature (e.g., about 15 degrees Celsius to about 30 degrees Celsius), the ALD film/substrate may be optionally heated to about 200 degrees to about 400 degrees Celsius as indicated at 304. In other embodiments, the ALD film/substrate may be optionally heated from about 15 degrees Celsius to about 400 degrees Celsius. The PVD chamber environment may be maintained at a room temperature or at a medium to high temperature and very low pressure environment during the ALD film treatment. In some embodiments, the temperature of the substrate and/or ALD film is maintained at about 325 degrees Celsius. The ALD film on the substrate can be composed of any type of material or combinations of material. For the sake of brevity, the examples of the embodiments use TaN or NbN as the ALD film to be treated. The ALD film before being treated in the PVD chamber has the typical properties associated with ALD in that if used as a barrier film, the film is conformal but with low density and high resistivity, making the ALD film a poor barrier film.

Power is applied to a target, such as the target 114, a coil, such as the inductive coil 142, and a biasing component, such as RF power source 180, to generate sputtering/doping and plasma as indicated at 306 and 308. The target 114 is generally a metallic material and is sputtered using DC power from a power supply such as power supply 117. RF power can be used if the target 114 is a metal oxide material. In one embodiment, the coil, such as the inductive coil 142, is operated as a DC power source and as an RF power source with a frequency of about 0.1 MHz to about 99 MHz (e.g., about 1.8 MHz to about 2.2 MHz in some embodiments) while the biasing component, such as RF power source 180, is operated at a frequency greater than that of the frequency used for the inductive coil 142 (e.g., a frequency of about 13.56 MHz in some embodiments) (DC power may also be applied to the inductive coil 142 together with RF power). As illustrated in FIG. 2, the target 114 is sputtered which releases randomly directed ions that generally impact the substrate 218 at generally perpendicular incidence angles to dope the ALD film with material from the target 114 (e.g., tantalum, niobium, etc.). The inductive coil 142 is sputtered as well and the ions from the inductive coil 142 are directed at acute angles 204, 206 to the surface of the substrate 218.

The sputtering from the inductive coil 142 dopes the sidewalls, bevels and slopes of the substrate 218 with material from the inductive coil 142 (e.g., tantalum, niobium, etc.). The dual sources allow for selective doping of the ALD film.

The ALD film is simultaneously doped to increase density and etched to remove nitrogen from the film as indicated at 310. The PVD chamber environment, such as the interior volume 106, is filled with at least one gas, such as, for example, argon or argon and nitrogen or other noble gases and/or reactive gases, and at a pressure greater than zero pressure and less than about 10 mTorr. The gas, such as gas 208 of FIG. 2, is used to provide an etch of the substrate, such as substrate 218, to release nitrogen from the ALD film. If the pressure is not kept very low, some materials, such as tantalum, are very good oxygen getters and higher pressures would produce nitrogen oxide, making the nitrogen removal inefficient.

At the same time that the doping of the ALD film occurs, the gas 208, such as argon or argon and nitrogen, etc., provides a low energy (0 v to −300 v) etching of the surface of the substrate 218. The low energy etching allows for selective removal of the nitrogen from the ALD film. The low energy etching is selective because the etching removes nitrogen with negligible or no removal of tantalum or other material. The etching typically has the greatest effect on surfaces that are perpendicular to the substrate support such as the bottom of a via 220 that is to be used as a connection point. Because the etching rate is higher at the bottom of the via 220, the resistivity of the via 220 is greatly decreased. The sputtering of the inductive coil 142 aids in protecting those features of the substrate 218 that would be etched too excessively, maintaining a material thickness in those areas. The dual sources (first and second sources of a material)—target 114 and inductive coil 142—provide both bevel protection and off angle (acute angle) treatment for sidewalls. The treatment duration is up to about 10 seconds. In some embodiments, only the inductive coil 142 with a low voltage (0 v to −1000 v) is used as a source during treatment (the target 114 is not sputtered) and an argon etch is performed. The low voltage of the inductive coil 142 significantly reduces the sputtering of the inductive coil 142, leaving predominately only the argon etching. A PVD flash is generally performed after the argon etch to protect any bevel features of a device on a substrate. The PVD flash deposits a thin layer of PVD film (e.g., about 3 to about 20 Angstroms) to improve surface morphology.

In one embodiment, the RF power used for the inductive coil 142 is about 100 watts to about 5000 watts with the bias power at about 100 watts to about 1000 watts or less. The gas flow rate provided by the gas source 110 is about 100 sccm (standard cubic centimeters per minute) or less. The interior volume 106 pressure is maintained at about 3 mTorr. The substrate temperature is maintained by the thermal controller 138 at about 325 degrees Celsius. The treatment is about 2 seconds to about 3 seconds in duration. The short duration allows for a higher processing volume (e.g., throughput), especially when using an integrated system or cluster tool (see below, FIG. 4).

The ALD film, after being treated in the PVD chamber, has the typical properties associated with PVD processes but with the conformal properties of an ALD film. The dynamic treatment process creates a long lasting, high quality barrier film with high density and low resistivity.

Figure 4:
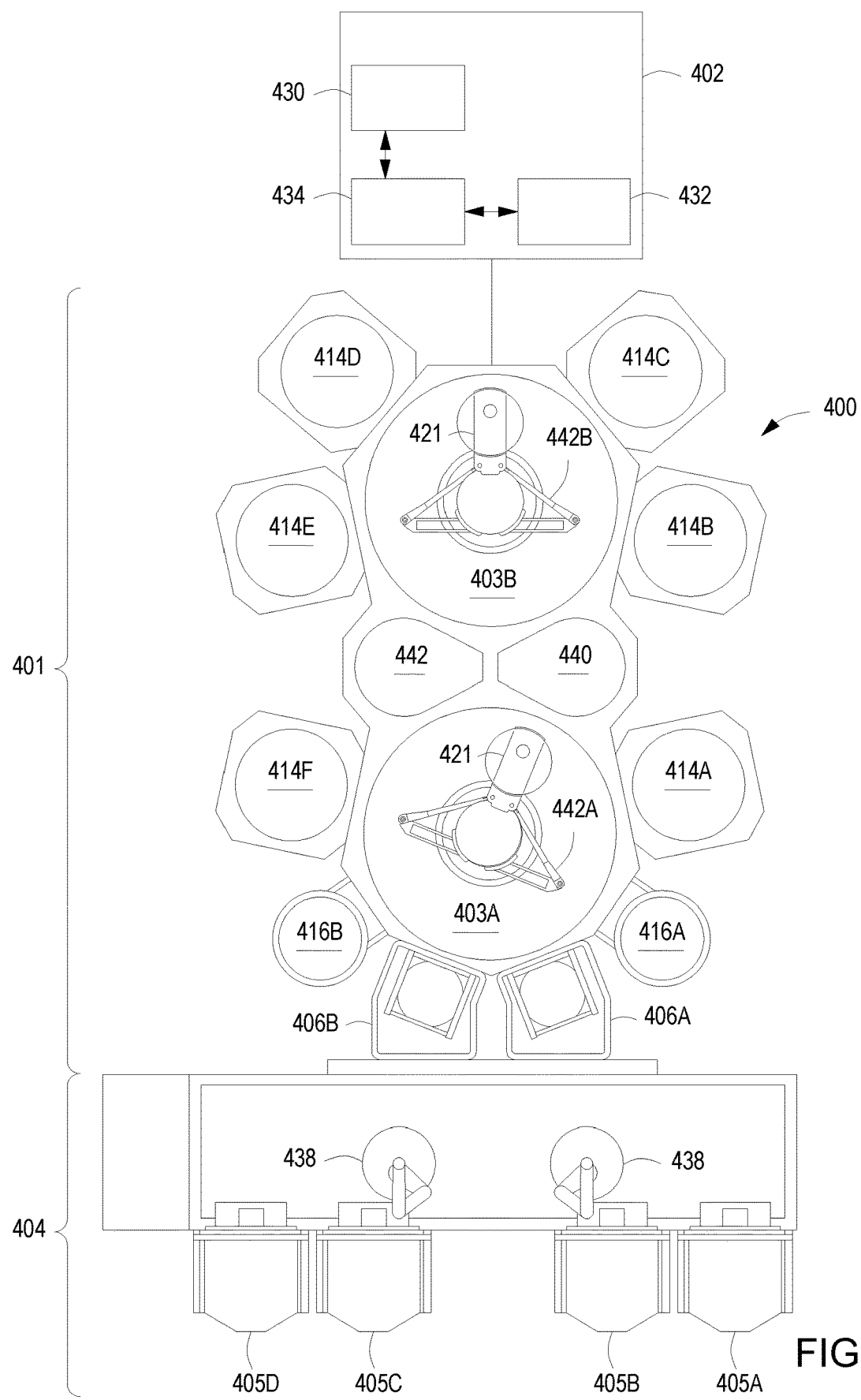
FIG. 4 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 400 (i.e., cluster tool) described below with respect to FIG. 4. The advantage of using an integrated tool 400 is that there is no vacuum break and no requirement to degas and pre-clean a substrate before treatment in a PVD chamber. Examples of the integrated tool 400 include the CENTURA® and ENDURA® integrated tools, available from Applied Materials, Inc., of Santa Clara, Calif. However, the methods described herein may be practiced using other cluster tools having suitable process chambers, or in other suitable process chambers. For example, in some embodiments the inventive methods discussed above may advantageously be performed in an integrated tool such that there are limited or no vacuum breaks between processes. For example, reduced vacuum breaks may limit or prevent contamination of the substrate.

The integrated tool 400 includes a vacuum-tight processing platform 401, a factory interface 404, and a system controller 402. The processing platform 401 comprises multiple processing chambers, such as 414A, 414B, 414C, 414D, 414E, and 414F operatively coupled to a vacuum substrate transfer chamber (transfer chambers 403A, 403B). The factory interface 404 is operatively coupled to the transfer chamber 403A by one or more load lock chambers (two load lock chambers, such as 406A and 406B shown in FIG. 4).

In some embodiments, the factory interface 404 comprises at least one docking station 407, at least one factory interface robot 438 to facilitate the transfer of the semiconductor substrates. The docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the load lock chambers, such as 406A and 406B. Each of the load lock chambers 406A and 406B have a first port coupled to the factory interface 404 and a second port coupled to the transfer chamber 403A. The load lock chamber 406A and 406B are coupled to a pressure control system (not shown) which pumps down and vents the load lock chambers 406A and 406B to facilitate passing the substrates between the vacuum environment of the transfer chamber 403A and the substantially ambient (e.g., atmospheric) environment of the factory interface 404. The transfer chambers 403A, 403B have vacuum robots 442A, 442B disposed in the respective transfer chambers 403A, 403B. The vacuum robot 442A is capable of transferring substrates 421 between the load lock chamber 406A, 406B, the processing chambers 414A and 414F and a cooldown station 440 or a pre-clean station 442. The vacuum robot 442B is capable of transferring substrates 421 between the cooldown station 440 or pre-clean station 442 and the processing chambers 414B, 414C, 414D, and 414E.

In some embodiments, the processing chambers 414A, 414B, 414C, 414D, 414E, and 414F are coupled to the transfer chambers 403A, 403B. The processing chambers 414A, 414B, 414C, 414D, 414E, and 414F comprise at least an atomic layer deposition (ALD) process chamber and a physical vapor deposition (PVD) process chamber. Additional chambers may also be provided such as CVD chambers, annealing chambers, additional ALD chambers, additional PVD chambers, or the like. ALD and PVD chambers may include any chambers suitable to perform all or portions of the methods described herein, as discussed above.

In some embodiments, one or more optional service chambers (shown as 416A and 416B) may be coupled to the transfer chamber 403A. The service chambers 416A and 416B may be configured to perform other substrate processes, such as degassing, orientation, substrate metrology, cool down and the like.

The system controller 402 controls the operation of the tool 400 using a direct control of the process chambers 414A, 414B, 414C, 414D, 414E, and 414F or alternatively, by controlling the computers (or controllers) associated with the process chambers 414A, 414B, 414C, 414D, 414E, and 414F and the tool 400. In operation, the system controller 402 enables data collection and feedback from the respective chambers and systems to optimize performance of the tool 400. The system controller 402 generally includes a Central Processing Unit (CPU) 430, a memory 434, and a support circuit 432. The CPU 430 may be any form of a general purpose computer processor that can be used in an industrial setting. The support circuit 432 is conventionally coupled to the CPU 430 and may comprise a cache, clock circuits, input/output subsystems, power supplies, and the like. Software routines, such as a method as described above may be stored in the memory 434 and, when executed by the CPU 430, transform the CPU 430 into a specific purpose computer (system controller 402). The software routines may also be stored and/or executed by a second controller (not shown) that is located remotely from the tool 400.

While the foregoing is directed to embodiments of the present disclosure, other and further embodiments of the disclosure may be devised without departing from the basic scope thereof.

The invention claimed is:

1. A method for performing a dynamic treatment on an atomic layer deposition (ALD) film on a substrate, comprising:
    pressurizing a physical vapor deposition (PVD) process chamber to a pressure greater than zero to less than about 10 mTorr;
    doping the ALD film by sputtering a first source of a first material and a second source of a second material onto the ALD film, the first source of the first material supplied with a first source RF power or a first source DC power and the second source of the second material supplied with a second source RF power at a first RF power frequency and with DC power;
    biasing the ALD film with a bias RF power at a second RF power frequency; and
    selectively removing nitrogen from the ALD film by etching the ALD film with a low energy etch with at least one gas while sputtering the first source of the first material and the second source of the second material.

2. The method of claim 1, further comprising:
    doping the ALD film by sputtering at an acute angle to the ALD film with the second source of the second material.

3. The method of claim 1, further comprising:
    etching the ALD film with at least one of a noble gas, a nitrogen-based gas, or an oxygen-based gas.

4. The method of claim 1, further comprising:
    sputtering with the second source of the second material at the first RF power frequency of about 1.8 MHz to about 2.2 MHz.

5. The method of claim 1, further comprising:
    biasing the ALD film with the second RF power frequency greater than the first RF power frequency.

6. The method of claim 1, further comprising:
    treating the ALD film at a temperature of about 15 degrees Celsius to about 400 degrees Celsius.

7. The method of claim 1, further comprising:
    performing the dynamic treatment up to about 10 seconds.

8. The method of claim 7, further comprising:
    performing the dynamic treatment for about 2 seconds to about 3 seconds.

9. The method of claim 1, further comprising:
    degassing and pre-cleaning the ALD film.

10. The method of claim 1, further comprising:
    selectively removing the nitrogen from the ALD film by etching the ALD film with the at least one gas in an about 0 volts to about −300 volts energy state while sputtering the second source of the second material at about 0 volts to about −1000 volts.

11. The method of claim 10, further comprising:
    doping the ALD film by sputtering the second source of the second material at an acute angle to a surface of the substrate.

12. The method of claim 1, further comprising:
    doping the ALD film by sputtering the ALD film with the first material or the second material based, at least partially, on tantalum or niobium.

13. The method of claim 1, further comprising:
    treating the ALD film comprising at least one of tantalum nitride or niobium nitride.

14. The method of claim 1, wherein the first material and the second material are composed of similar material.

15. A method for processing an atomic layer deposition (ALD) film on a substrate using an integrated tool, comprising:
    depositing the ALD film on a substrate in an ALD process chamber;
    transferring the substrate to a physical vapor deposition (PVD) process chamber without a vacuum break;
    pressurizing the PVD process chamber to a pressure greater than zero and less than about 10 mTorr;
    doping the ALD film with a first material and a second material simultaneously;
    doping the ALD film with the first material by sputtering the first material using DC power;
    doping the ALD film with the second material by sputtering the second material using a DC power and an RF power at a first RF power frequency;
    biasing the substrate with RF power at a second RF power frequency; and
    selectively removing nitrogen from the ALD film by etching the ALD film with a low energy etch with at least one gas while doping the ALD film with the first material and the second material.

16. The method of claim 15, further comprising:
    supplying the first RF power frequency at a power level of about 100 watts to about 5000 watts; and
    supplying the second RF power frequency at a power level of about 100 watts to about 1000 watts.

17. The method of claim 15, further comprising:
    flowing the at least one gas to etch the ALD film at a rate less than about 100 sccm.

18. The method of claim 15, further comprising:
    doping the ALD film with a source of the second material located at an acute angle to a surface of the substrate.

19. An apparatus for film deposition on a substrate, comprising:
    a plasma vapor deposition (PVD) process chamber having an interior volume with a substrate support, a target of a first sputtering material, and an inductive coil of a second sputtering material located between the substrate support and the target;
    a gas supply fluidly coupled to the interior volume of the process chamber that provides an etching gas;

a first power supply interacting with the substrate support to supply an RF power at a first frequency;

a second power supply interacting with the inductive coil to supply a first DC power and an RF power at a second frequency less than the first frequency, the second power supply configured to at least cause the second sputtering material to sputter;

a third power supply interacting with the target to supply a second DC power; and a controller that adjusts a first RF power level of the first power supply, a second RF power level of the second power supply, a first DC power level of the second power supply, and a second DC power level of the third power supply while sputtering the first sputtering material of the target and the second sputtering material of the inductive coil and while regulating a flow of the etching gas into the interior volume of the process chamber, the controller configured to selectively remove nitrogen from an atomic layer deposition (ALD) film by low energy etching of the ALD film during doping of the ALD film by sputtering the first sputtering material and the second sputtering material.

* * * * *